United States Patent
Herzum (10) Patent No.: US 6,946,339 B2
(45) Date of Patent: Sep. 20, 2005

(54) METHOD FOR CREATING A STEPPED STRUCTURE ON A SUBSTRATE

(75) Inventor: Christian Herzum, Poecking (DE)

(73) Assignee: Infineon Technologies AG, Munich (DE)

(*) Notice: Subject to any disclaimer, the term of this patent is extended or adjusted under 35 U.S.C. 154(b) by 68 days.

(21) Appl. No.: 10/750,405

(22) Filed: Dec. 31, 2003

(65) Prior Publication Data

US 2004/0185646 A1 Sep. 23, 2004

Related U.S. Application Data

(63) Continuation of application No. PCT/EP02/07314, filed on Jul. 2, 2002.

(30) Foreign Application Priority Data

Jul. 2, 2001 (DE) .......................................... 101 31 917

(51) Int. Cl.[7] ..................... H01L 21/8238; H01L 21/76; H01L 21/475; H01L 21/261; H01L 21/8242
(52) U.S. Cl. ........................ 438/222; 438/224; 438/419; 438/420; 438/527; 438/942; 257/E21.33; 257/E21.258; 257/E21.644; 148/DIG. 117
(58) Field of Search ................................. 438/222, 224, 438/419, 420, 527, 942; 257/E21.33, E21.258, E21.644; 148/DIG. 117

(56) References Cited

U.S. PATENT DOCUMENTS

| | | | | |
|---|---|---|---|---|
| 4,282,648 A | | 8/1981 | Yu et al. | |
| 4,803,179 A | * | 2/1989 | Neppl et al. | 438/420 |
| 4,868,136 A | | 9/1989 | Ravaglia | |
| 5,104,829 A | * | 4/1992 | Shida | 438/551 |
| 5,254,489 A | * | 10/1993 | Nakata | 438/258 |
| 5,362,670 A | * | 11/1994 | Iguchi et al. | 438/228 |
| 5,432,114 A | * | 7/1995 | O | 438/217 |
| 5,502,009 A | * | 3/1996 | Lin | 438/275 |
| 5,554,554 A | * | 9/1996 | Bastani et al. | 438/210 |
| 5,576,226 A | * | 11/1996 | Hwang | 438/275 |
| 5,580,807 A | * | 12/1996 | Sery et al. | 438/128 |
| 5,801,416 A | | 9/1998 | Choi et al. | |
| 5,943,566 A | * | 8/1999 | Wang | 438/238 |
| 6,025,234 A | | 2/2000 | Chou | |
| 6,150,220 A | * | 11/2000 | Huh et al. | 438/275 |
| 6,184,083 B1 | * | 2/2001 | Tsunashima et al. | 438/257 |

FOREIGN PATENT DOCUMENTS

| | | |
|---|---|---|
| DE | 31 10 477 C2 | 5/1990 |
| EP | 0 399 527 A2 | 5/1990 |

OTHER PUBLICATIONS

English Translation of Abstract for Japanese Publication No. 02087675, Mar. 28, 1990.

* cited by examiner

*Primary Examiner*—Long Pham
*Assistant Examiner*—Shrinivas H. Rao
(74) *Attorney, Agent, or Firm*—Maginot, Moore & Beck (57) ABSTRACT

In a method for creating a stepped structure on a substrate, which at least includes a first portion with a first thickness and a second portion with a second thickness, at first a layer sequence of a first oxide layer, a first nitride layer, and a second oxide layer is applied onto the substrate. Then a portion of the second oxide layer and a portion of the first nitride layer are removed to expose a portion of the first oxide layer. Then a part of the first nitride layer is removed to establish the first region of the stepped structure. Then the thickness of the first oxide layer is changed at least in the established first region to establish the first thickness of this region. Subsequently, a further part of the first nitride layer is removed to establish a second region of the stepped structure.

17 Claims, 8 Drawing Sheets

METHOD FOR CREATING A STEPPED STRUCTURE ON A SUBSTRATE

This application is a continuation of PCT Patent Application No. PCT/EP02/07314, filed on Jul. 2, 2002, which claims priority to German Patent Application Number 10131917.7, filed on Jul. 2, 2001.

BACKGROUND OF THE INVENTION

1. Field of the Invention

The present invention relates to a method for creating a stepped structure on a substrate, and in particular to a self-adjusting method for creating a stepped structure, such as a gate oxide for an MOS transistor.

2. Description of the Related Art

In some applications for the production of semiconductor devices, it may be desirable to form stepped structures. One such application involves for example certain MOS transistors (MOS=metal oxide semiconductor), such as a LDMOS transistor (LDMOS=laterally diffused metal oxide semiconductor). It is advantageous if the dielectric of a gate electrode, the gate oxide, has a lower thickness on the source side than on the drain side, so that a so-called step gate oxide is formed. This step gate oxide links the demands for a lower turn-on resistance $R_{on}$, i.e. a gate oxide as thin as possible, and for a high electrical strength, i.e. a gate oxide as thick as possible.

In the prior art, methods are already known by means of which such an oxide step can be produced, and these methods are described as "dual-gox" processes in which after the production of the oxide step an adjustment of the gate electrode to this step is required.

This known method is not self-adjusting, so that restrictions result due to the limited adjusting possibilities of the exposure instruments used. The disadvantage of the gate structures produced in this way is that a particular gate length cannot be fallen short of and certain tolerances cannot be achieved.

A further disadvantage of the conventional methods is that a different doping of source regions and drain regions, as it is for example required in a LDMOS transistor, is possible only in a very difficult manner or even not at all in short gate structures.

SUMMARY OF THE INVENTION

It is the object of the present invention to provide an improved method for creating a stepped structure on a substrate.

In accordance with a first aspect, the present invention provides a method for creating a stepped structure on a substrate, wherein the stepped structure includes at least a first portion with a first thickness and a second portion with a second thickness, with the following steps: (a) applying a layer sequence of a first oxide layer, a first nitride layer, and a second oxide layer to the substrate; (b) removing a portion of the second oxide layer and a portion of the first nitride layer to expose a portion of the first oxide layer; (c) removing a part of the first nitride layer above the first oxide layer and below the second oxide layer to establish the first region of the stepped structure; (d) changing the thickness of the first oxide layer at least in the first region established in step (c) to establish the first thickness thereof; and (e) removing a part of the first nitride layer above the first oxide layer and below the second oxide layer to establish the second region of the stepped structure.

According to the present invention, the stepped structure is produced in a self-adjusting manner.

As opposed to conventional processes, the present invention has the advantage that by the self-adjusting method smaller gate lengths and/or lower tolerances are possible as they can be achieved with conventional methods and the correspondingly existing lithography methods.

A further advantage of the present invention is that it enables different doping of the source regions and the drain regions, as it is for example required in a LDMOS transistor, even in very short gate structures.

BRIEF DESCRIPTION OF THE DRAWINGS

These and other objects and features of the present invention will become clear from the following description taken in conjunction with the accompanying drawings, in which:

FIG. 1A to 1M show a first embodiment of the method according to the invention; and FIG. 2A to 2M show a second embodiment of the method according to the invention.

DESCRIPTION OF THE PREFERRED EMBODIMENTS

On the basis of FIG. 1, a first preferred embodiment of the present invention will now be explained in greater detail, wherein the various procedural steps according to this preferred embodiment will be explained in greater detail on the basis of FIG. 1A to 1M.

In FIG. 1A, a semiconductor structure is illustrated that includes a substrate 100 comprising a first main surface 102 as well as a second main surface 104. On the first main surface 102 of the substrate 100, which is a silicon substrate in the embodiment illustrated, a layer sequence 106 is created that includes a first oxide layer 108 disposed on the substrate 100, a nitride layer 110 disposed on the first oxide layer 108, and a second oxide layer 112 disposed on the nitride layer 110. In the embodiment illustrated, the oxide layers 108 and 112 are silicon dioxide layers and the nitride layer 110 is a silicon nitride layer. In FIG. 1A, the silicon oxide/silicon nitride/silicon oxide sandwich 106 applied to the starting material (substrate) is illustrated.

In a subsequent procedural step, the second or upper oxide layer 112 and the first nitride layer 110 are structured using a lithography step and subsequent etching, whereby the structure illustrated in FIG. 1B results, in which a portion 114 of the first oxide layer is exposed, so that in this region the surface of the first oxide layer 108 facing away from the substrate 100 is exposed.

Subsequently, the first nitride layer 110 is selectively etched back wet-chemically to remove part of the nitride layer below the second oxide layer 112 and above the first oxide layer 108. Hereby, the length of the first region of the gate oxide to be created is adjusted. In the embodiment illustrated, the thicker portion of the stepped gate oxide structure to be created is hereby adjusted. The wet-chemical selective etching takes place for example by means of hot phosphoric acid (~80% $H_3PO_4$, T~155° C.) for a period of time of e. g. 25 minutes.

In FIG. 1C, the resulting structure after the etching of the nitride layer 110 is shown. As can be seen, a region 116 has been exposed below the second oxide layer 112, in which the nitride layer 110 has been etched back. The length of a first region of the step structure to be created is designated with X1.

In a subsequent step, an oxidation is conducted to increase the thickness of the first oxide layer 108 in the exposed region 114 as well as in the region 116. The result of this procedural step is shown in FIG. 1D, and, as can be seen, the oxide layer 108 has been expanded in the region 114 and in the region 116 relative to its original thickness, and in this region the oxide layer is provided with the reference numeral 118. Due to the oxidation conducted, it may occur that in a wall region 120 of the nitride layer 110 an oxide (NiOx) forms, which has to be removed by very short oxide etching.

Subsequently, again a selective wet-chemical etching back of the nitride layer 110 takes place to remove a further part of the nitride layer below the second oxide layer 112 and above the first oxide layer 108. Hereby, the length of the region with a thinner gate oxide is adjusted. As already in the first wet-chemical etching step of the nitride layer 110, the etching here takes place for example by means of hot phosphoric acid (~80% $H_3PO_4$, T~155° C.) with an etching rate of 4 nm/min at a period of time of about 25 minutes.

In FIG. 1E, the resulting structure is shown. As can be seen, the exposed region 116 below the oxide layer 112 has been expanded by the wet-chemical etching, the length of this new region being indicated with X2. In FIG. 1E, the stepped structure of the oxide 108, 118, can already be recognized.

Subsequently to a further etching step, a conform deposition of a polysilicon layer 122 onto the whole surface of the structure takes place, so that the structure shown in FIG. 1F results. The polysilicon layer 122 is then anisotropically and selectively etched back to the silicon oxide layers, so that the structure shown in FIG. 1G results, in which the polysilicon only remains in the region 116. At this point of the production process, there is now the possibility for an implant, whereby the region (below the thick oxide layer) lying to the right of the future gate structure in FIG. 1G is doped, but not the region in the substrate lying to the left of the future gate structure in FIG. 1G, i.e. below the remaining nitride layer 110.

In a further procedural step, a further silicon nitride layer 124 as well as a further oxide layer 126 are conformly deposited on the structure in a full-area manner, so that the structure shown in FIG. 1H results.

Then the further silicon oxide layer 126 is anisotropically and selectively etched back to the silicon nitride, so that an oxide remainder 128 remains at a topology step, as it is shown in FIG. 1I. The topology step has resulted by initial exposing of the region 114 and the subsequent filling of the region 116 with the polysilicon.

Subsequently hereto, the silicon nitride layer 124 is also selectively etched to the silicon oxide, and in addition to the oxide remainder 128 a nitride remainder 130 remains at the topology step, as it is shown in FIG. 1J.

The silicon oxide, i. e. the layers 112 and 118, as well the remainder 128 are then etched in a full-area manner and selectively to the silicon nitride, and if possible selectively to the silicon, so that the structure illustrated in FIG. 1K results.

Subsequently, the nitride layer 110 and the nitride remainder 130 are etched selectively, so the structure shown in FIG. 1L results, in which then, if required, the oxide layer 108, 118 is anisotropically and selectively etched to the silicon of the substrate, so that the final stepped structure 132 results, as it is illustrated in FIG. 1M.

Subsequently, on the basis of FIG. 2, a second preferred embodiment of the method according to the invention will be explained in greater detail, wherein, in the subsequent description of individual procedural steps, those procedural steps that have already been described on the basis of FIG. 1 are not described again.

The procedural steps described in FIG. 2A to 2C correspond to the procedural steps described on the basis of FIG. 1A to 1C, and the structure resulting after them (see FIG. 2C) corresponds to that, as it results after the corresponding procedural steps according to FIG. 1A to 1C.

The method according to the second embodiment differs from the first embodiment in so far as, after the first etching of the silicon nitride layer 110, the oxide layer 108 is now thinned, unlike in the first embodiment in which it was made thicker. As can been seen in FIG. 2D, the oxide of the first oxide layer 108 no longer covered by the silicon nitride after the etching of the silicon nitride layer 110 was thinned, so that the thinned oxide layer 118 has formed. Preferably, for procedural reasons, the thinning of the oxide layer 108 will take place such that the oxide layer 108 is at first completely removed in the region 114 and 116, and then a new oxide layer whose thickness is smaller than the thickness of the original oxide layer 108 is created by oxidation. The nitride oxide (NiOx) forming on the nitride side wall 120 due to the oxidation is then removed with a very short oxide etching.

Figure 1:
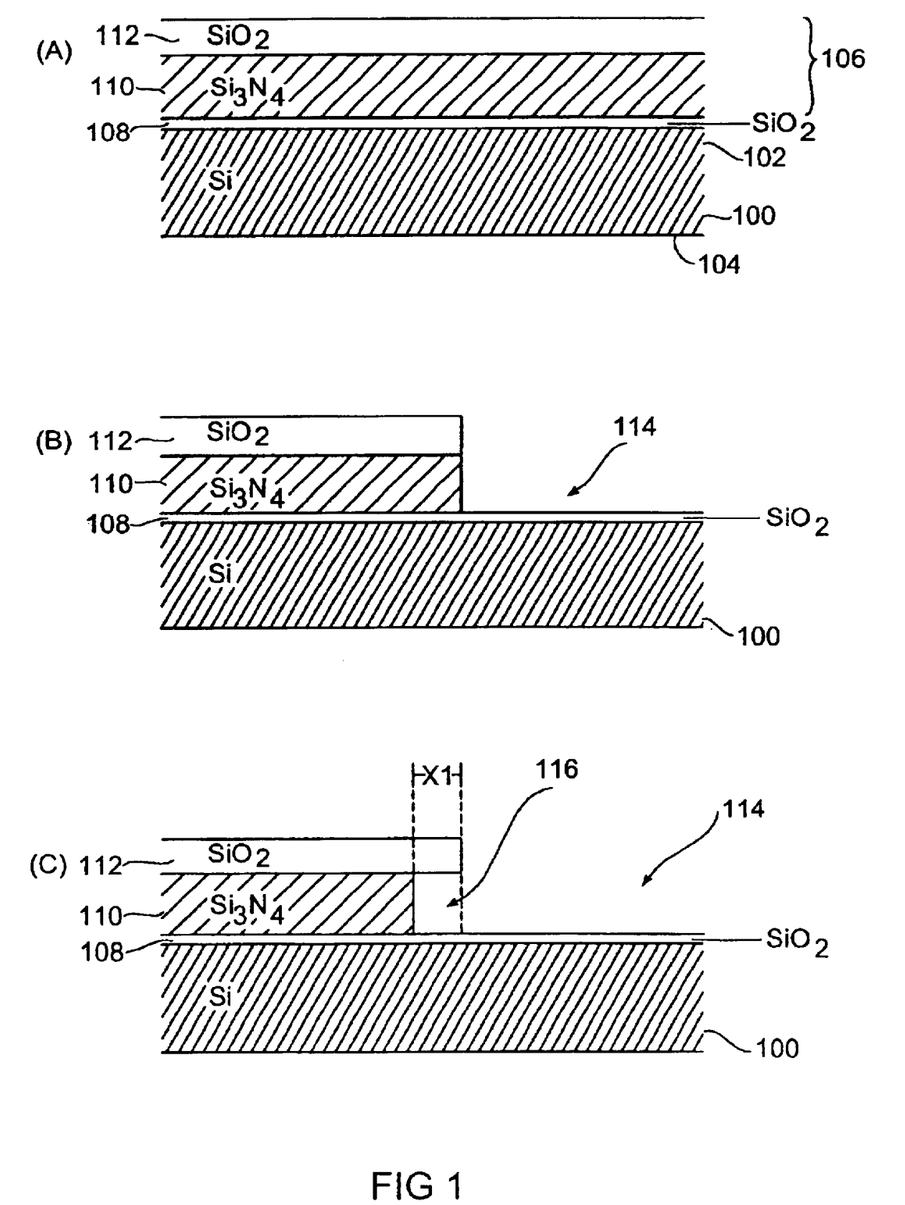
Figure 2:
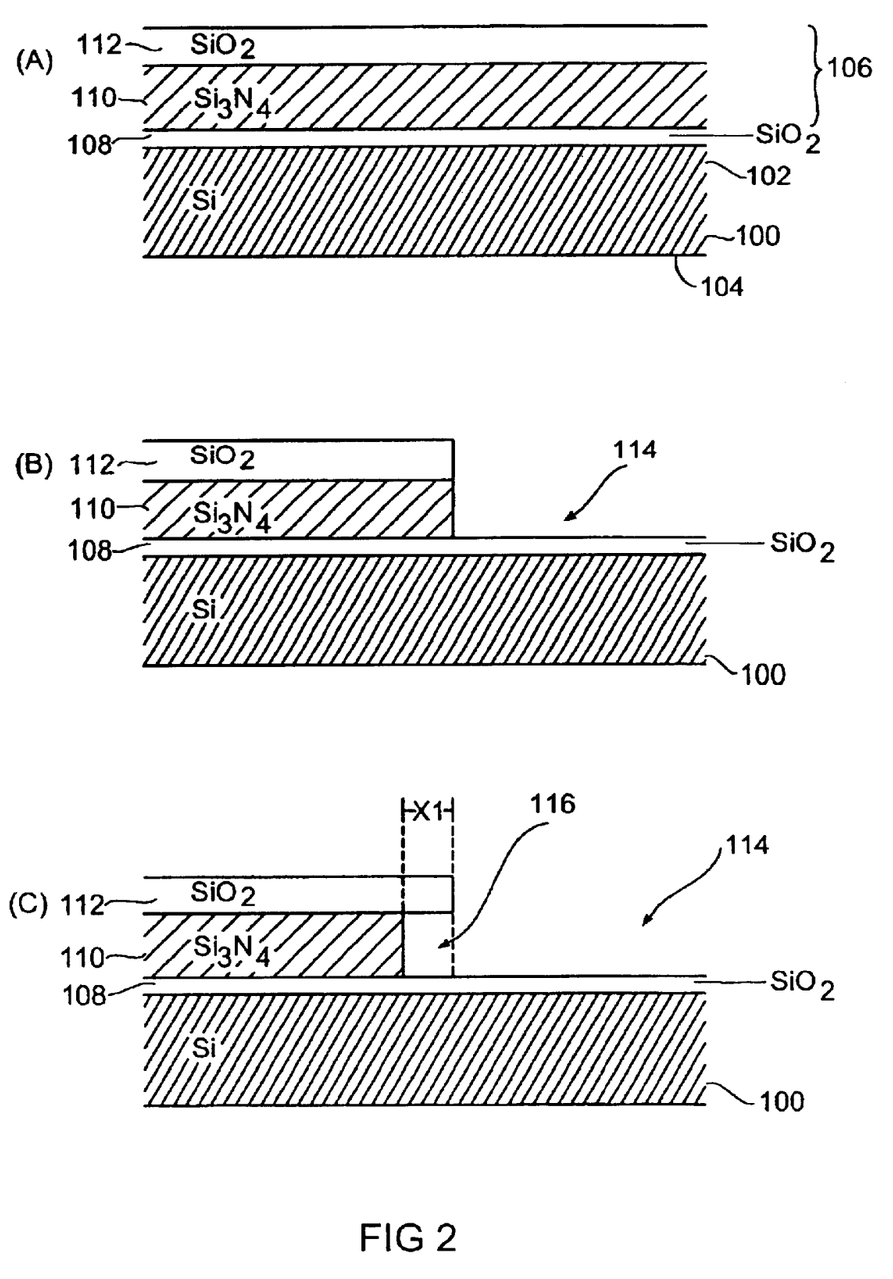

Unlike the embodiment described on the basis of FIG. 1, according to FIG. 2, now the thinner region of the stepped structure of the gate oxide is formed at first, and after this step the silicon nitride layer 110 is again selectively etched back wet-chemically, whereby the length X2, now of the thicker region of the stepped structure, is adjusted.

The remaining steps for the completion of the structure shown on the basis of FIG. 2F to 2M correspond to the steps described on the basis of FIG. 1F to 1M, and with regard to the more detailed explanation of these steps reference is made to the previous description of FIG. 1F to 1M.

In a similar way as in the first embodiment, in the second embodiment, an implant may also take place at this point of the production process after the creation of the step structure (see FIG. 2G), whereby the region (below the thinner oxide layer) lying to the right of the future gate structure is doped, but not the region in the substrate lying to the left of the future gate structure in FIG. 2G, i.e. below the remaining nitride layer 110. Unlike the first embodiment (FIG. 1), in the second embodiment (FIG. 2), the implant thus takes place in the region of the thinner oxide and not in the region of the thicker oxide.

In the above description of the preferred embodiments, a silicon substrate 100 was used, and the oxide layers are $SiO_2$ layers. The nitride layers are $Si_3N_4$ layers. The present invention is not limited to these materials, but other suitable materials for the production of the stepped structure, such as organic materials, may also be employed. Furthermore, the polysilicon gate may be replaced by tungsten. Instead of a silicon substrate, a silicon carbide substrate may also be used.

The advantage of the present invention is that it provides a self-adjusting method for the production of the stepped structure 132 (see FIG. 1M or FIG. 2M), wherein very short gate structures can be achieved by the method according to the invention. Regarding the dimension of the gate structure, no theoretical limitations exist. According to an embodiment, the gate length ranges between 0.1 $\mu$m and 0.5 $\mu$m, wherein the portion of the thin region is between 20% and 80% of the overall length.

Although the above method has been described on the basis of the production of a gate oxide layer for a MOS transistor, the present invention is not limited hereto, but rather finds its application in all semiconductor structures in which stepped structures are required.

As described above, the silicon nitride layer 110 is wet-chemically etched two times selectively, wherein here preferably hot phosphoric acid (~80% $H_3PO_4$, T~155° C.) is employed as an etchant at an etching rate of 4 nm/min. In the embodiments illustrated, equal lengths of about 0.1 µm are chosen for the two regions of the stepped structure, which is achieved by an etching period of about 25 minutes. In general, the wet-chemical etching may be performed using hot phosphoric acid (~80% $H_3PO_4$, T~155° C.) with an etching rate of 1 nm/min to 20 nm/min for a period of time of 1 minute to 400 minutes. Instead of the polysilicon layer, another electrically conducting layer may be used.

The present invention is not limited to the above-described production steps. Depending on the structures to be created, individual steps may be modified or omitted, or other steps may be inserted.

The present invention is not limited to the above-described embodiments. In addition to the described structures, structures with more than one step may also be created by the method according to the invention. In this case, repeated etching of the nitride layer 110 as well as a repeated oxidation (FIG. 1) or repeated thinning (FIG. 2) of the oxide layer takes place to thus create several steps.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for creating a stepped structure on a substrate, wherein the stepped structure includes at least a first portion with a first thickness and a second portion with a second thickness, comprising:
   (a) applying a layer sequence of a first oxide layer, a first nitride layer, and a second oxide layer to the substrate;
   (b) removing a portion of the second oxide layer and a portion of the first nitride layer to expose a portion of the first oxide layer;
   (c) removing a part of the first nitride layer above the first oxide layer and below the second oxide layer to establish the first region of the stepped structure;
   (d) changing the thickness of the first oxide layer at least in the first region established in step (c) to establish the first thickness thereof; and
   (e) removing a part of the first nitride layer above the first oxide layer and below the second oxide layer to establish the second region of the stepped structure.

2. Method of claim 1, comprising:
   (f) exposing the stepped structure.

3. Method of claim 1, wherein the step (d) includes the step of increasing the thickness of the first oxide layer at least in the first region.

4. Method of claim 3, wherein the step of increasing includes an oxidation.

5. Method of claim 1, wherein the step (d) includes the step of thinning the first oxide layer at least in the first region.

6. Method of claim 5, wherein the step of thinning includes the etching of the first oxide layer.

7. Method of claim 5, wherein the step of thinning includes the following steps:
   removing the first oxide layer at least in the first region; and
   applying a new oxide layer at least in the first region with a thickness smaller than the thickness of the first oxide layer.

8. Method of claim 1, wherein the steps (c) and (e) include selective wet-chemical etching of the first nitride layer.

9. Method of claim 8, wherein the wet-chemical etching takes place using hot phosphoric acid (~80% $H_3PO_4$, T~155° C.) at an etching rate of 1 nm/min to 20 nm/min for a period of time of 1 minute to 400 minutes.

10. Method of claim 1, wherein the step (b) includes the following steps:
    (b.1) applying and structuring a photoresist on the layer sequence to establish regions to be exposed; and
    (b.2) etching the second oxide layer and the first nitride layer up to the first oxide layer.

11. Method of claim 1, comprising after step (e):
    depositing an electrically conducting layer in the first region and in the second region.

12. Method of claim 1, comprising after step (e):
    performing an implant with respect to the substrate to form a doped region in the portion of the substrate only covered by the first oxide layer.

13. Method of claim 11, wherein the electrically conducting layer is conformly deposited on the substrate and then etched anisotropically and selectively to the oxide layers.

14. Method of claim 11, wherein the step (f) comprises:
    (f.1) depositing a second nitride layer;
    (f.2) depositing a third oxide layer;
    (f.3) removing the third oxide layer selectively to the second nitride layer, so that an oxide remainder remains at a step formed by the exposing of the first oxide layer in step (b);
    (f.4) removing the second nitride layer selectively to the second oxide layer, so that the nitride remainder remains at the step;
    (f.5) removing the oxide layers selectively to the nitride layers and selectively to the substrate;
    (f.6) removing the nitride layers; and
    (f.7) removing the first oxide layer outside the first and second regions.

15. Method of claim 1, wherein the stepped structure is a gate oxide of a MOS transistor.

16. Method of claim 1, wherein the oxide layers are $SiO_2$ layers, wherein the nitride layers are $Si_3N_4$ layers, wherein the substrate is a Si substrate, and wherein the electrically conducting layer is a polysilicon layer.

17. Method of claim 1, wherein in step (d) the thickness of the first oxide layer is repeatedly changed to create a structure with a plurality of steps.

* * * * *